United States Patent [19]
Atriss et al.

[11] Patent Number: 5,081,428
[45] Date of Patent: Jan. 14, 1992

[54] VOLTAGE CONTROLLED OSCILLATOR HAVING 50% DUTY CYCLE CLOCK

[75] Inventors: Ahmad H. Atriss, Chandler; Benjamin C. Peterson, Tempe; Lanny L. Parker, Mesa, all of Ariz.

[73] Assignee: Codex Corp., Mansfield, Mass.

[21] Appl. No.: 677,057

[22] Filed: Mar. 29, 1991

[51] Int. Cl.⁵ .......................................... H03B 1/00
[52] U.S. Cl. ................................ 331/57; 331/108 B
[58] Field of Search .......... 331/25, 57, 108 R, 108 B, 331/135

[56] References Cited
U.S. PATENT DOCUMENTS 4,853,654 8/1989 Sakurai .............................. 331/57

Primary Examiner—Robert J. Pascal
Attorney, Agent, or Firm—Bradley J. Botsch

[57] ABSTRACT

A voltage controlled oscillator (VCO) generates a 50% duty cycle clock. The 50% duty cycle clock is derived directly from the operating frequency of the VCO thereby abating the need for the VCO to operate at twice the desired clock frequency. This allows the VCO to be utilized in high frequency phase-locked loop systems.

11 Claims, 3 Drawing Sheets

VOLTAGE CONTROLLED OSCILLATOR HAVING 50% DUTY CYCLE CLOCK

CROSS REFERENCE TO RELATED APPLICATIONS

This application is related to the subject matter of an application having Ser. No. 07/677,056, a filing date of Mar. 29, 1991, and assigned to the same assignee of the subject application.

BACKGROUND OF THE INVENTION

This invention relates to oscillator circuits, for example, a voltage controlled oscillator circuit for a phase-lock-loop.

Phase-locked-loop (PLL) circuits are utilized in many applications to provide an output signal that is substantially the same frequency and phase of an input reference signal. The main components of a PLL circuit comprise a phase/frequency detector, a loop filter, a voltage controlled oscillator (VCO), and an optional divide by N block which is typically implemented with a counter. When in lock, the output signal of the VCO, signal $VCO_{OUT}$, is substantially N times the frequency and phase as the input reference signal. The phase/frequency detector typically has two inputs and two outputs. The two inputs include the input reference signal and the divide by N VCO feedback signal, signal $VCO_{OUT}/N$, while the two outputs of the phase/frequency detector provide an UP and a DOWN signal. The phase/frequency detector compares the input reference signal to signal $VCO_{OUT}/N$ and operates such that if the frequency of signal $VCO_{OUT}/N$ is lower than the frequency of the input reference signal, the UP signal functions to increase the operating frequency of the VCO. Furthermore, if the frequency of signal $VCO_{OUT}/N$ is at a higher frequency than the input reference signal, the DOWN signal functions to decrease the operating frequency of the VCO. Further, when the phase-locked-loop is in lock, the input reference signal and signal $VCO_{OUT}/N$ are substantially equal in frequency and phase.

VCO's are designed to operate at a predetermined frequency based upon an applied control voltage wherein an internal 50% duty cycle clock is typically derived from the VCO operating frequency. Further, the 50% duty cycle clock is typically equal to one-half of the operating frequency of the VCO and is generated by passing the output signal of the VCO through a divide by 2 block. Therefore, in order to obtain a 50% duty cycle clock at 40 MHz, the VCO would have to be operating at 80 MHz. However, the frequency and frequency-gain factor of typical VCO's are sensitive to process and temperature variations. As a result, if the frequency-gain factor of the VCO is large, then the VCO typically becomes unstable and sensitive to noise. Further, this could impose a limit on designing high frequency phase-locked loop systems.

Hence, a need exists for a voltage controlled oscillator circuit which directly provides a 50% duty cycle clock.

SUMMARY OF THE INVENTION

Briefly, there is provided a circuit for providing an output signal comprising a first current mirror circuit responsive to a control voltage and having a first plurality of transistors for respectively sinking a first plurality of currents; a second current mirror circuit responsive to the control voltage and having a second plurality of transistors for respectively sourcing a second plurality of currents, the first and second plurality of transistors having a predetermined width-to-length ratios such that the first plurality of currents is substantially equal to the second plurality of currents, respectively; a plurality of serially coupled voltage controlled inverters for providing an output signal at an output of a last one of the plurality of serially coupled voltage controlled inverters, each one of the plurality of serially coupled voltage controlled inverters being responsive to respective ones of the first and second plurality of currents; and an inverter circuit having an input and an output and including first and second transistors, the input of the inverter circuit being coupled to the output of the last one of the plurality of serially coupled voltage controlled inverters, the output of the inverter circuit being coupled to an input of a first one of the plurality of serially coupled voltage controlled inverters, the first transistor of the inverter circuit having a predetermined size ratio with respect to the second transistor of the inverter circuit such that the output signal of the circuit has a duty cycle substantially equal to 50%.

It is an advantage of the present invention to provide a voltage controlled oscillator circuit which directly provides a 50% duty cycle clock. It is also an advantage of the present invention to provide a 50% duty cycle clock directly from the operating frequency of a voltage controlled oscillator thereby abating the need to operate the VCO at twice the frequency of the 50% duty cycle clock.

The above and other advantages and features of the present invention will be better understood from the detailed description taken in conjunction with the accompanying drawings.

DETAILED DESCRIPTION OF THE INVENTION

Figure 1:
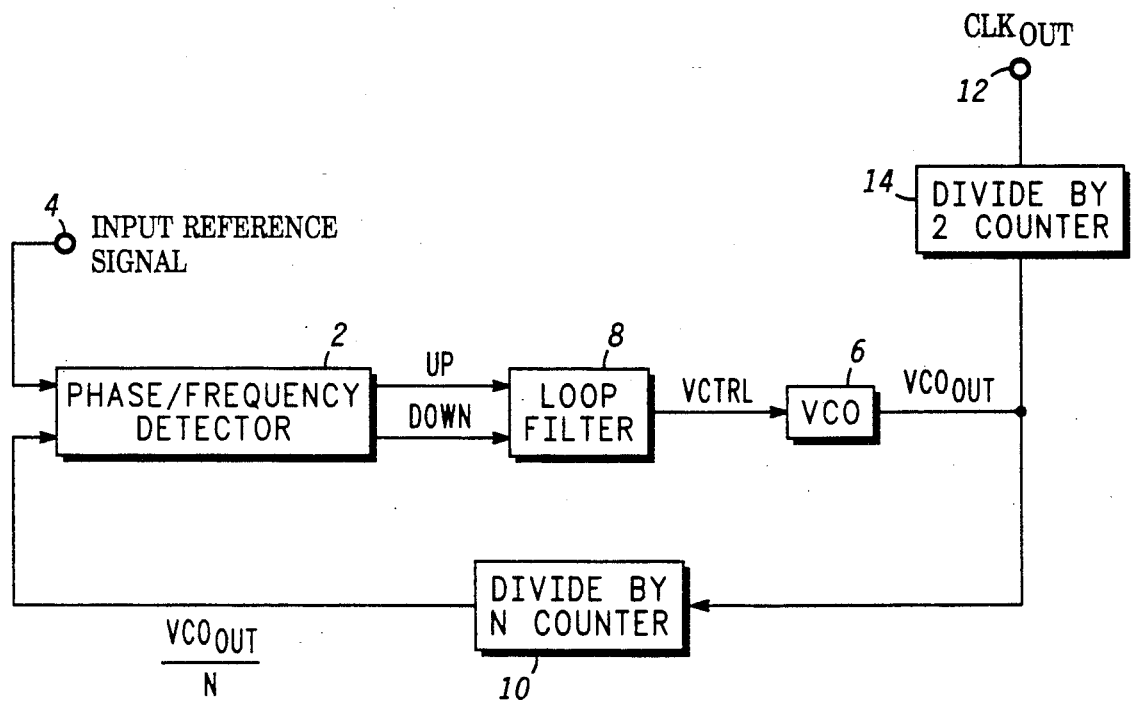
FIG. 1 is a block diagram illustrating a typical phase-locked-loop circuit.

Referring to FIG. 1, a block diagram illustrating a typical phase-locked-loop is shown comprising phase/frequency detector 2 having a first input coupled to input terminal 4 at which an input reference signal is applied and a second input coupled to an output of divide by N counter 10. The first output of phase/frequency detector 2 provides signal UP to a first input of loop filter 8 while the second output of phase/frequency detector 2 provides signal down to a second input of loop filter 8. The output of loop filter 8 supplies control voltage signal VCTRL to an input of voltage controlled oscillator (VCO) 6 wherein VCO 6 has an output for providing signal $VCO_{OUT}$. Signal $VCO_{OUT}$ is supplied to the first input of divide by N counter 10 which provides signal $VCO_{OUT}/N$. Further, signal $VCO_{OUT}$ is supplied to an input of divide by 2 counter 14 which has an output for providing signal $CLK_{OUT}$ at terminal 12.

Briefly, the speed of VCO 6 is controlled by divide factor N wherein the output of divide by N counter 10 is compared to the input reference signal such that the higher the divide factor N, the faster VCO 6 needs to run to keep up with the input reference signal. In particular, phase/frequency detector 2 compares the input reference signal with the output signal of divide by N counter 10 and provides UP and DOWN output signals to loop filter 8. It is understood that divide by N counter 10 frequency divides its input signal $VCO_{OUT}$ by N thereby providing signal $VCO_{OUT}/N$ at its output. Loop filter 8 converts the digital outputs of phase/frequency detector 2 to analog control voltage VCTRL such that if signal $VCO_{OUT}/N$ is at a lower frequency than the input reference signal, then the UP signal will be in a first logic state thereby adjusting voltage VCTRL of loop filter 8 to increase the output frequency of VCO 6. Likewise, if signal $VCO_{OUT}/N$ is at a higher frequency than the input reference signal, then the DOWN signal will be in a first logic state thereby adjusting voltage VCTRL of loop filter 8 to decrease the output frequency of VCO 6. Further, when both the UP and DOWN signals are in a second logic state, signal $VCO_{OUT}/N$ is substantially the same phase and frequency of the input reference signal and signal $VCO_{OUT}$ of VCO 6 will be oscillating at N times the input reference signal. Further, signal $VCO_{OUT}$ is divided by 2 via counter 14 to obtain 50% duty cycle clock signal $CLK_{OUT}$ at terminal 12. Thus, signal $CLK_{OUT}$ will be at a frequency that is substantially equal to one-half the frequency of signal $VCO_{OUT}$.

Figure 2:
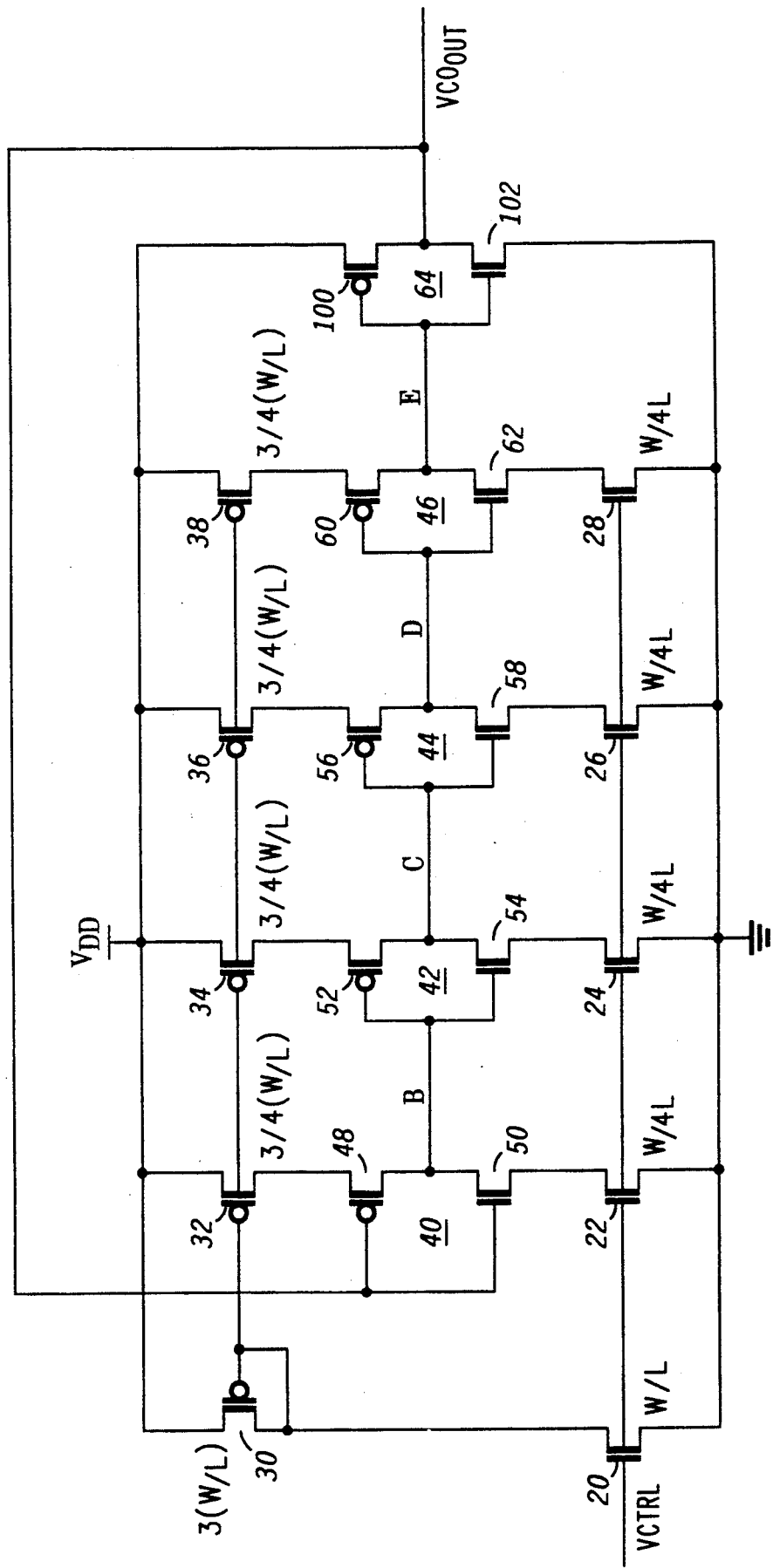
FIG. 2 is a detailed schematic diagram illustrating a voltage controlled oscillator circuit in accordance with the present invention.

Referring to FIG. 2, a detailed schematic diagram of a voltage controlled oscillator is shown comprising a first current mirror circuit which includes NMOS transistors 20, 22, 24, 26 and 28 wherein the gate electrodes of each are coupled to receive control voltage VCTRL and the source electrodes of each are returned to ground. The drain electrode of NMOS transistor 20 is coupled to the drain and gate electrodes of PMOS transistor 30 wherein a second current mirror circuit is formed by PMOS transistors 30, 32, 34, 36 and 38. The source electrode of PMOS transistor 30 is coupled to a first supply voltage terminal at which the operating potential $V_{DD}$ is applied. The gate electrodes of PMOS transistors 32, 34, 36 and 38 are coupled to the gate electrode of PMOS transistor 30 while the source electrodes of PMOS transistors 32, 34, 36 and 38 are coupled to receive operating potential $V_{DD}$. The voltage controlled oscillator also comprises voltage controlled CMOS inverters 40, 42, 44 and 46 wherein inverter 40 includes PMOS transistor 48 and NMOS transistor 50. Inverter 42 includes PMOS transistor 52 and NMOS transistor 54 while inverter 44 includes PMOS transistor 56 and NMOS transistor 58. Likewise, inverter 46 includes PMOS transistor 60 and NMOS transistor 62. The output of inverter 46 is coupled to an input of inverter 64, the latter having an output coupled back to the input inverter 40. The output of inverter 64 also provides output signal $VCO_{OUT}$ at terminal 12. Further, the output of inverters 40, 42, 44 and 46 respectively provide signals B, C, D and E.

Inverter 64 includes PMOS transistor 100 and NMOS transistor 102. The gate electrodes of PMOS transistor 100 and NMOS transistor 102 which form the input of inverter 64 are coupled to the output of inverter 46 while the common drain electrode of the same which form the output of inverter 64 are coupled to output terminal 12 and to the input of inverter 40. The source electrode of PMOS transistor 100 is coupled to operating potential $V_{DD}$ while the source electrode of PMOS transistor 102 is returned to ground.

Turning back to inverters 40, 42, 44 and 46, the source electrodes of PMOS transistors 48, 52, 56 and 60 are respectively coupled to the drain electrodes of PMOS transistors 32, 34, 36 and 38. In a similar manner, the source electrodes of NMOS transistors 50, 54, 58 and 62 are respectively coupled to the drain electrodes of NMOS transistors 22, 24, 26 and 28. The gate electrodes of PMOS transistor 48 and NMOS transistor 50 are coupled to the output of inverter 64 while the common drain electrodes of the same are coupled to the common gate electrodes of PMOS transistor 52 and NMOS transistor 54. The common drain electrodes of PMOS transistor 52 and NMOS transistor 54 are coupled to the common gate electrodes of PMOS transistor 56 and NMOS transistor 58. Likewise, the common drain electrodes of PMOS transistor 56 and NMOS transistor 58 are coupled to the common gate electrodes of PMOS transistor 60 and NMOS transistor 62. Also, the drain electrodes of PMOS transistor 60 and NMOS transistor 62 are coupled to the input of inverter 64. It is understood that the common gate electrodes of PMOS and NMOS transistors 48 and 50 form the input of inverter 40. Likewise, the common gate electrodes of transistors 52 and 54, 56 and 58, and 60 and 62 respectively form the input of inverters 42, 44 and 46. Further, the common drain electrodes of PMOS and NMOS transistors 48 and 50 form the output of inverter 40. Likewise, the common drain electrodes of transistors 52 and 54, 56 and 58, and 60 and 62 respectively form the output of inverters 42, 44 and 46.

In operation, control voltage VCTRL supplies a voltage to the gate electrodes of NMOS transistors 20, 22, 24, 26 and 28 thereby providing corresponding currents to flow through NMOS transistors 20, 22, 24, 26 and 28. The current flowing through NMOS transistor 20 also flows through PMOS transistor 30. This current provides a predetermined voltage at the gate electrode of PMOS transistor 30 which is also applied to the gate electrodes of PMOS transistors 32, 34, 36 and 38 thereby providing corresponding predetermined currents to flow through PMOS transistors 32, 34, 36 and 38. It is understood that PMOS transistors 32, 34, 36 and 38 respectively source current to the outputs of inverters 40, 42, 44 and 46 when PMOS transistors 48, 52, 56 and 60 are rendered operative, respectively, thereby charging the respective voltages occuring thereat. Likewise, NMOS transistors 22, 24, 26 and 28 respectively sink current from the outputs of inverters 40, 42, 44 and 46 when NMOS transistors 50, 54, 58 and 62 are rendered operative, respectively, thereby discharging the respective voltages occurring thereat.

Figure 3:
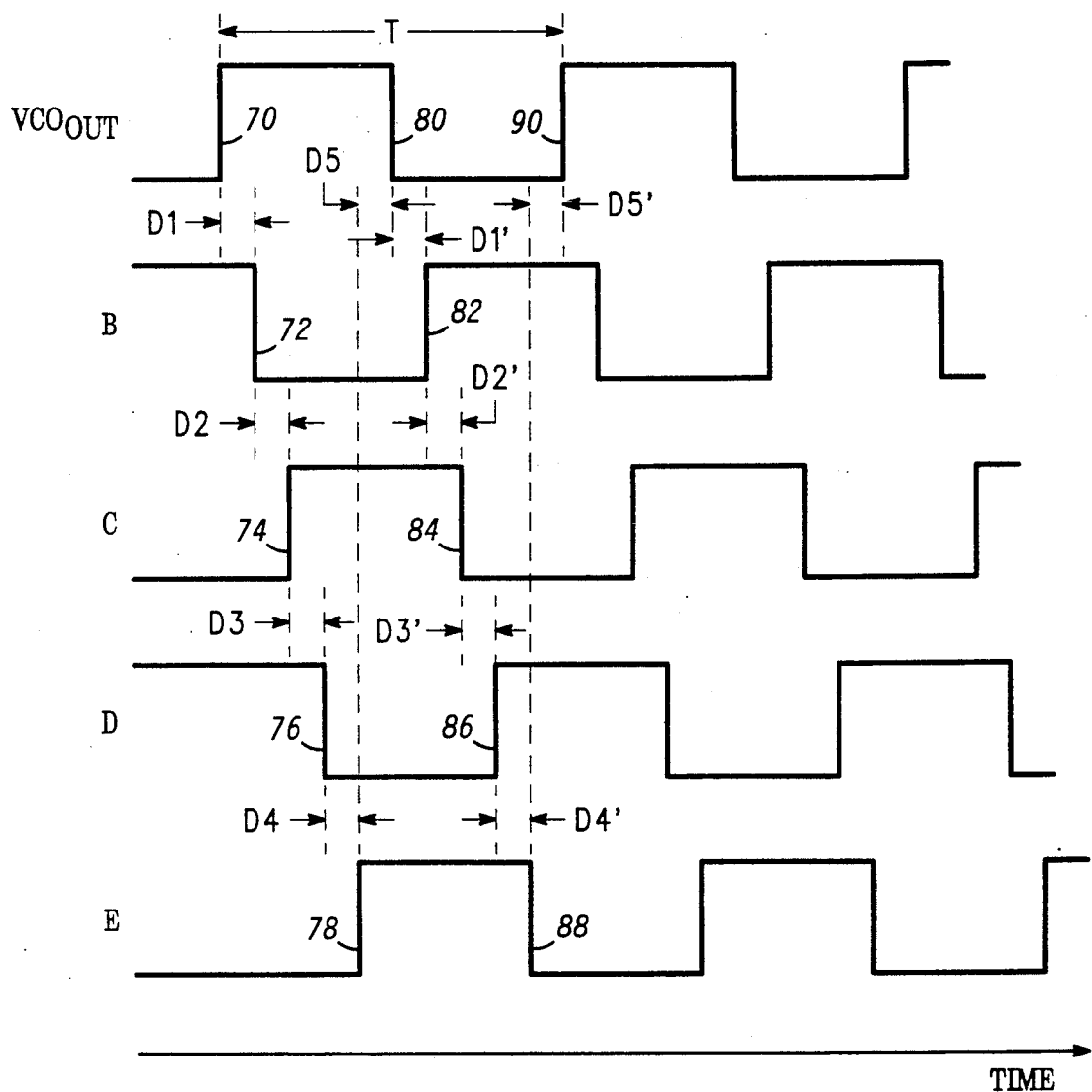
FIG. 3 is a graphical representation of various signals generated from the voltage controlled oscillator circuit of FIG. 2.

Referring to FIG. 3, a graphical representation of signals $VCO_{OUT}$, B, C, D and E is shown for illustrating how signal $VCO_{OUT}$ is generated. As a starting point, assume that rising transition 70 is occurring on signal $VCO_{OUT}$. This rising transition is fed back to the input of voltage controlled inverter 40 thereby generating falling transition 72 at the output of inverter 40 after a finite time delay of D1. It is understood that time delay D1 is a function of the propagation delay of inverter 40 and of the capacitance present at the output of inverter 40 wherein a larger the capacitance at the output of inverter 40 corresponds to a longer time delay D1 since it takes longer for a predetermined current to discharge the voltage at the output of inverter 40. Falling transition 72 is subsequently passed through voltage controlled inverter 42 thereby generating rising transition 74 at the output of inverter 42 after a finite time delay of D2. Likewise, time delay D2 is a function of the propagation delay of inverter 42 and of the capacitance present at the output of inverter 42 wherein a larger the capacitance at the output of inverter 42 corresponds to a longer time delay D2 since it takes longer for a predetermined current to charge the voltage at the output of inverter 42. In a similar manner, rising transition 74 is subsequently passed through voltage controlled inverter 44 thereby generating falling transition 76 at the output of inverter 44 after a finite time delay of D3. Also, falling transition 76 is then passed through voltage controlled inverter 46 thereby generating rising transition 78 at the output of inverter 46 after a finite time delay of D4. Now it must be realized that rising transition 78 is passed through inverter 64 to generate falling transition 80 on signal $VCO_{OUT}$ after a finite time delay of D5. It is understood that time delays D3, D4 and D5 are respectively a function of the propagation delays of inverters 44, 46 and 64 and of the capacitance present respectively at the outputs of inverters 44, 46 and 64.

In a similar manner, falling transition 80 is fed back to the input of voltage controlled inverter 40 thereby generating rising transition 82 at the output of inverter 40 after a finite time delay of D1'. It is understood that time delay D1' is a function of the propagation delay of inverter 40 and of the capacitance present at the output of inverter 40 wherein a larger the capacitance at the output of inverter 40 corresponds to a longer time delay D1' since it takes longer for a predetermined current to charge the voltage at the output of inverter 40. Rising transition 82 is subsequently passed through voltage controlled inverter 42 thereby generating falling transition 84 at the output of inverter 42 after a finite time delay of D2'. Likewise, time delay D2' is a function of the propagation delay of inverter 42 and of the capacitance present at the output of inverter 42 wherein a larger the capacitance at the output of inverter 42 corresponds to a longer time delay D2' since it takes longer for a predetermined current to discharge the voltage at the output of inverter 42. In a similar manner, falling transition 84 is subsequently passed through voltage controlled inverter 44 thereby generating rising transition 86 at the output of inverter 44 after a finite time delay of D3'. Also, rising transition 86 is then passed through voltage controlled inverter 46 thereby generating falling transition 88 at the output of inverter 46 after a finite time delay of D4'. As aforedescribed, it must be realized that falling transition 88 is passed through inverter 64 to generate rising transition 90 on signal $VCO_{OUT}$ after a finite time delay of D5'. It is understood that time delays D3', D4' and D5' are respectively a function of the propagation delays of inverters 44, 46 and 64 and of the capacitance present respectively at the outputs of inverters 44, 46 and 64. Hence, in this manner, signal $VCO_{OUT}$ is generated and provided at terminal 12. Further, the period of signal $VCO_{OUT}$ is denoted by T and is substantially equal to the sum of time delays D1, D2, D3, D4 and D5 plus the sum of time delays D1', D2', D3', D4' and D5'.

As control voltage VCTRL is changed, the frequency of signal $VCO_{OUT}$ is correspondingly changed. For example, when control voltage VCTRL is increased, NMOS transistor 20 is turned on harder and, thus, more current flows through NMOS transistor 20 and PMOS transistor 30. This increased current is mirrored from NMOS transistor 20 to NMOS transistors 22, 24, 26 and 28 and from PMOS transistor 30 to PMOS transistors 32, 34, 36 and 38. As a result, more current is sourced and sunk to and from the outputs of inverters 40, 42, 44 and 46. This has the effect of decreasing time delays D1-D4 and D1'-D4' since there is more current available to cause a transition respectively at the outputs of inverters 40, 42, 44 and 46. Hence, the frequency of signal $VCO_{OUT}$ increases. On the other hand, when control voltage VCTRL is decreased, NMOS transistor 20 is turned more off and, thus, less current flows through NMOS transistor 20 and PMOS transistor 30. This decreased current is mirrored from NMOS transistor 20 to NMOS transistors 22, 24, 26 and 28 and from PMOS transistor 30 to PMOS transistors 32, 34, 36 and 38. As a result, less current is sourced and sunk to and from the outputs of inverters 40, 42, 44 and 46. This has the effect of increasing time delays D1-D4 and D1'-D4' since there is less current available to cause a transition respectively at the outputs of inverters 40, 42, 44 and 46. Hence, the frequency of signal $VCO_{OUT}$ decreases. In summary, the frequency of signal $VCO_{OUT}$ is a function of time delays D1-D5 and D1'-D5' wherein as the sum of the time delays increases, the frequency of signal $VCO_{OUT}$ decreases. On the other hand, as the sum of the time delays decreases, the frequency of signal $VCO_{OUT}$ increases.

It should be realized that if the sum of time delays D1 through D5 are respectively equal to the sum of time delays D1' through D5', signal $VCO_{OUT}$ will have a duty cycle substantially equal to 50%. The present invention provides a circuit such that the current sunk from the output of inverter 40 via transistor 22 is substantially equal to the current sourced to the output of inverter 40 via transistor 32. This would yield time delay D1 substantially equal to time delay D1'. Likewise, the current sunk from the outputs of inverters 42, 44 and 46 via transistors 24, 26 and 28, respectively, are made substantially equal to the current sourced to the outputs of inverters 42, 44 and 46 via transistors 34, 36 and 38, respectively. This yields time delays D2, D3 and D4 substantially equal to time delays D2', D3' and D4', respectively.

It is an aspect of the present invention to provide a novel voltage controlled oscillator circuit which generates an output signal which can be directly utilized as a clock signal having a 50% duty cycle. Thus, the 50% duty cycle output signal operates at substantially the same frequency as the VCO thereby abating the need to use a divide by two counter.

Turning back to FIG. 2, the width-to-length (W/L) ratio of PMOS transistor 30 is made a predetermined multiple of the W/L ratio of NMOS transistor 20, for example, 3, whereby the width-to-length ratio of transistor 20 is denoted by W/L. This allows the voltage at the gate electrode of PMOS transistor 30 to change at substantially the same rate as control voltage VCTRL. Further, the W/L ratio of PMOS transistors 32, 34, 36 and 38 is a predetermined multiple of the W/L ratio of PMOS transistors 30, for example, one-fourth as denoted by $\frac{3}{4}$(W/L), while the W/L ratio of transistors 22, 24, 26, 28 is a predetermined multiple of the W/L ratio of PMOS transistors 20, for example, one-fourth as denoted by (W/4L). Further, transistors 22, 24, 26, 28, 32, 34, 36 and 38 may be designed to have minimum channel length.

In operation, a predetermined current, I, flows through transistors 20 and 30 whereby current I is a function of the applied control voltage VCTRL. Further, current I is proportional to the W/L ratio of transistor 20 as illustrated in Eqn. 1.

$$I \alpha (W/L)_{20} \times [V_{GS(20)} - V_{T(20)}]^2 \qquad (1)$$

where
- $(W/L)_{20}$ is the width-to-length ratio of transistor 20;
- $V_{GS(20)}$ is the gate-to-source voltage across transistor 20; and
- $V_{T(20)}$ is the threshold voltage of transistor 20.

Since the gate-to-source voltages of transistors 20, 22, 24, 26 and 28 are all substantially equal, current I is mirrored from transistor 20 to transistors 22, 24, 26 and 28. However, since the W/L ratio of transistors 22, 24, 26 and 28 is one-fourth the W/L ratio of transistor 20, the currents flowing through transistors 22, 24, 26 and 28 is substantially equal to I/4.

Current I is also proportional to the parameters of transistor 30 as illustrated in Eqn. 2.

$$I \alpha (W/L)_{30} \times [V_{GS(30)} - V_{T(30)}]^2 \qquad (2)$$

where
- $(W/L)_{30}$ is the width-to-length ratio of transistor 30;
- $V_{GS(30)}$ is the gate-to-source voltage across transistor 30; and
- $V_{T(30)}$ is the threshold voltage of transistor 30.

Similarly, the gate-source voltages of transistors 30, 32, 34, 36 and 38 are all substantially equal and current I is mirrored from transistor 30 to transistors 32, 34, 36 and 38. Further, since the W/L ratio of transistors 32, 34, 36 and 38 is one-fourth the W/L ratio of transistor 30, the currents flowing through transistors 32, 34, 36 and 38 is substantially equal to I/4. Since the currents sunk from the outputs of inverters 40, 42, 44 and 46 are substantially equal to current I/4 and the currents sourced to the outputs of inverters 40, 42, 44 and 46 are substantially equal to current I/4, it follows that the falling transition of each inverter is respectively equal to the rising transition of each inverter. Thus, time delays D1, D2, D3 and D4, by design, are substantially equal to time delays D1', D2', D3' and D4', respectively.

It is known that variations, mismatches and non-linearities between PMOS transistors 30, 32, 34, 36 and 38 and NMOS transistors 20, 22, 24, 26 and 28 can typically exist which can cause minor differences in the current being sourced and sunk in each of the voltage controlled inverters. This, of course, would mean that the sum of time delays D1–D5 would not be equal to the sum of time delays D1'–D5' thereby resulting in a duty cycle other than 50%. However, these variations can be compensated for by inverter 64 such that the width of PMOS transistor 100 can be adjusted with respect to the width of NMOS transistor 102. This will effectively adjust time delay D5' with respect to time delay D5 thereby tweaking the duty cycle of signal VCO$_{OUT}$ to be equal to 50%. As an example, suppose that time delay D1 is longer than time delay D1' by time d1. If time delay D5 was shortened with respect to time delay D5' by time d1, then signal VCO$_{OUT}$ would still maintain a 50% duty cycle. Thus, signal VCO$_{OUT}$ can be directly utilized as a clock with a 50% duty cycle and does not need to be divided down by two to obtain a 50% duty cycle clock. This will improve the tracking time, noise margin and stability of a phase-locked-loop system and will allow the phase-locked-loop system to inherently operate at higher frequencies.

It is important to realize that the present invention sets the W/L ratio of transistors 22, 24, 26 and 28 to be a predetermined multiple with respect to the W/L ratio of transistor 20, for example, one-fourth. Likewise, the W/L ratio of transistors 32, 34, 36 and 38 is a predetermined multiple with respect to the W/L ratio of transistor 20, for example, one-fourth. Thus, if the W/L ratio of say transistor 22 varies by as much as 10%, the current flowing through transistor 22 will at most vary by only 2.5% (1/40) from the its nominal value of I/4. It is understood that the above applies not only to transistor 22 but also in a similar manner to transistors 24, 26, 28, 32, 34, 36 and 38. Further, it should be understood that if the predetermined W/L ratio of transistor 20 with respect to transistors 22, 24, 26 and 28 increases along with a corresponding increase of the predetermined W/L ratio of transistor 30 with respect to transistors 32, 34, 36 and 38, then the effects of any mismatches between the P-channel and the N-channel MOS transistors will be lessened.

By now it should be apparent from the foregoing discussion that a novel voltage controlled oscillator circuit for directly generating a 50% duty cycle clock has been provided.

What is claimed is:

1. A circuit for providing an output signal, comprising:
   a first current mirror circuit responsive to a control voltage and having a first plurality of transistors for respectively sinking a first plurality of currents;
   a second current mirror circuit responsive to said control voltage and having a second plurality of transistors for respectively sourcing a second plurality of currents, said first and second plurality of transistors having a predetermined width-to-length ratios such that said first plurality of currents is substantially equal to said second plurality of currents, respectively;
   a plurality of serially coupled voltage controlled inverters for providing an output signal at an output of a last one of said plurality of serially coupled voltage controlled inverters, each one of said plurality of serially coupled voltage controlled inverters being responsive to respective ones of said first and second plurality of currents; and
   an inverter circuit having an input and an output and including first and second transistors, said input of said inverter circuit being coupled to said output of said last one of said plurality of serially coupled voltage controlled inverters, said output of said inverter circuit being coupled to an input of a first one of said plurality of serially coupled voltage controlled inverters, said first transistor of said inverter circuit having a width that is adjusted with respect to a width of said second transistor of said inverter circuit such that the output signal of the circuit has a duty cycle substantially equal to 50%.

2. The circuit according to claim 1 wherein said inverter circuit includes:
   said first transistor having first, second and control electrodes, said first electrode of said first transistor of said inverter circuit being coupled for providing the output signal of the circuit and to an input of said plurality of serially coupled voltage controlled inverters, said control electrode of said first transistor of said inverter circuit being coupled to said output of said plurality of serially coupled voltage controlled inverters, and said second electrode of said first transistor of said inverter circuit being coupled to a first supply voltage terminal; and said second transistor having first, second and control electrodes, said first electrode of said second transistor of said inverter circuit being coupled to said first electrode of said first transistor of said inverter circuit, said control electrode of said first transistor of said inverter circuit being coupled to said control electrode of said first electrode of said inverter circuit, and said second electrode of said second transistor being coupled to a second supply voltage terminal.

3. The circuit according to claim 2 wherein said first plurality of transistors includes:

a first transistor having first, second and control electrodes, said first electrode of said first transistor being coupled for sinking a first one of said first plurality of currents, said control electrode of said first transistor being coupled to said control voltage, and said second electrode of said first transistor being coupled to said first supply voltage terminal;

a second transistor having first, second and control electrodes, said first electrode of said second transistor being coupled for sinking a second one of said first plurality of currents, said control electrode of said third transistor being coupled to receive said control voltage, and said second electrode of said second transistor being coupled to said first supply voltage terminal;

a third transistor having first, second and control electrodes, said first electrode of said third transistor being coupled for sinking a third one of said first plurality of currents, said control electrode of said third transistor being coupled to receive said control voltage, and said second electrode of said third transistor being coupled to said first supply voltage terminal; and a fourth transistor having first, second and control electrodes, said first electrode of said fourth transistor being coupled for sinking a fourth one of said first plurality of currents, said control electrode of said fourth transistor being coupled to receive said control voltage, and said second electrode of said fourth transistor being coupled to said first supply voltage terminal.

4. The circuit according to claim 3 wherein said second plurality of transistors includes:

a first transistor having first, second and control electrodes, said first electrode of said first transistor of said second plurality of transistors being coupled for sourcing a first one of said second plurality of currents, said control electrode of said first transistor of said second plurality of transistors being coupled to receive said control voltage, and said second electrode of said second transistor of said second plurality of transistors being coupled to said second supply voltage terminal;

a second transistor having first, second and control electrodes, said first electrode of said second transistor of said second plurality of transistors being coupled for sourcing a second one of said second plurality of currents, said control electrode of said second transistor of said second plurality of transistors being coupled to said control electrode of said first transistor of said second plurality of transistors, and said second electrode of said second transistor of said second plurality of transistors being coupled to said second supply voltage terminal;

a third transistor having first, second and control electrodes, said first electrode of said third transistor of said second plurality of transistors being coupled for sourcing a third one of said second plurality of currents, said control electrode of said third transistor of said second plurality of transistors being coupled to said control electrode of said first transistor of said second plurality of transistors, and said second electrode of said third transistor of said second plurality of transistors being coupled to said second supply voltage terminal; and a fourth transistor having first, second and control electrodes, said first electrode of said fourth transistor of said second plurality of transistors being coupled for sourcing a fourth one of said second plurality of currents, said control electrode of said fourth transistor of said second plurality of transistors being coupled to said control electrode of said first transistor of said second plurality of transistors, and said second electrode of said fourth transistor of said second plurality of transistors being coupled to said second supply voltage terminal.

5. The voltage controlled oscillator circuit according to claim 4 wherein each one of said plurality of serially coupled voltage controlled inverters includes:

a first transistor having first, second and control electrodes, said first electrode of said first transistor of each one of said plurality of serially coupled voltage controlled inverters being respectively coupled to an output of each one of said plurality of serially coupled voltage controlled inverters, said control electrode of said first transistor of each one of said plurality of serially coupled voltage controlled inverters being respectively coupled to an input of each one of said plurality of serially coupled voltage controlled inverters, and said second electrodes of said first transistor of each one of said plurality of serially coupled voltage controlled inverters being respectively coupled to receive said first plurality of currents, and a second transistor having first, second and control electrodes, said first electrode of said second transistor of each one of said plurality of serially coupled voltage controlled inverters being respectively coupled to said first electrode of said first transistor of each one of said plurality of serially coupled voltage controlled inverters, said control electrode of said second transistor of each one of said plurality of serially coupled voltage controlled inverters being respectively coupled to said control electrode of said first transistor of each one of said plurality of serially coupled voltage controlled inverters, and said second electrodes of said second transistors of each one of said plurality of serially coupled voltage controlled inverters being respectively coupled to receive said second plurality of currents.

6. In a phase-locked loop circuit, a voltage controlled oscillator circuit, comprising:

first circuit means responsive to a control voltage for sinking a first plurality of currents;

second circuit means responsive to said control voltage for sourcing a second plurality of currents, ones of said first plurality of currents being substantially equal to respective ones of said second plurality of currents;

a plurality of serially coupled voltage controlled inverters for providing an output signal at an output, each one of said plurality of serially coupled voltage controlled inverters being responsive to respective ones of said first and second plurality of currents; and third circuit means responsive to said output signal of said plurality of serially coupled voltage controlled inverters and having first and second transistors, said third circuit means having an output coupled to an input of a first one of said plurality of serially coupled voltage controlled inverters and for providing an output signal of the voltage controlled oscillator circuit, said first transistor having a width that is adjusted with respect to a width of said second transistor such that said output signal of the voltage controlled oscillator circuit has a duty cycle substantially equal to 50%.

7. The circuit according to claim 6 wherein said third circuit means includes:

said first transistor having first, second and control electrodes, said first electrode of said first transistor of said third circuit means being coupled for providing the output signal of the circuit and to an input of said plurality of serially coupled voltage controlled inverters, said control electrode of said first transistor of said third circuit means being coupled to said output of said plurality of serially coupled voltage controlled inverters, and said second electrode of said first transistor of said third circuit means being coupled to a first supply voltage terminal; and said second transistor having first, second and control electrodes, said first electrode of said second transistor of said third circuit means being coupled to said first electrode of said first transistor of said third circuit means, said control electrode of said first transistor of said third circuit means being coupled to said control electrode of said first electrode of said first transistor of said third circuit means, and said second electrode of said second transistor being coupled to a second supply voltage terminal.

8. The circuit according to claim 7 wherein said first circuit means includes:

a first transistor having first, second and control electrodes, said first electrode of said first transistor being coupled for sinking a first one of said first plurality of currents, said control electrode of said first transistor being coupled to receive said control voltage, and said second electrode of said first transistor being coupled to said first supply voltage terminal;

a second transistor having first, second and control electrodes, said first electrode of said second transistor being coupled for sinking a second one of said first plurality of currents, said control electrode of said third transistor being coupled to receive said control voltage, and said second electrode of said second transistor being coupled to said first supply voltage terminal;

a third transistor having first, second and control electrodes, said first electrode of said third transistor being coupled for sinking a third one of said first plurality of currents, said control electrode of said third transistor being coupled to receive said control voltage, and said second electrode of said third transistor being coupled to said first supply voltage terminal; and a fourth transistor having first, second and control electrodes, said first electrode of said fourth transistor being coupled for sinking a fourth one of said first plurality of currents, said control electrode of said fourth transistor being coupled to receive said control voltage, and said second electrode of said fourth transistor being coupled to said first supply voltage terminal.

9. The circuit according to claim 8 wherein said second circuit means includes:

a first transistor having first, second and control electrodes, said first electrode of said first transistor of said second circuit means being coupled for sourcing a first one of said second plurality of currents, said control electrode of said first transistor of said second circuit means being coupled to receive said control voltage, and said second electrode of said second transistor of said second circuit means being coupled to said second supply voltage terminal;

a second transistor having first, second and control electrodes, said first electrode of said second transistor of said second circuit means being coupled for sourcing a second one of said second plurality of currents, said control electrode of said second transistor of said second circuit means being coupled said control electrode of said first transistor of said second circuit means, and said second electrode of said second transistor of said second circuit means being coupled to said second supply voltage terminal;

a third transistor having first, second and control electrodes, said first electrode of said third transistor of said second circuit means being coupled for sourcing a third one of said second plurality of currents, said control electrode of said third transistor of said second circuit means being coupled to said control electrode of said first transistor of said second circuit means, and said second electrode of said third transistor of said second circuit means being coupled to said second supply voltage terminal; and a fourth transistor having first, second and control electrodes, said first electrode of said fourth transistor of said second circuit means being coupled for sourcing a fourth one of said second plurality of currents, said control electrode of said fourth transistor of said second circuit means being coupled to said control electrode of said first transistor of said second circuit means, and said second electrode of said fourth transistor of said second circuit means being coupled to said second supply voltage terminal.

10. The voltage controlled oscillator circuit according to claim 9 wherein each one of said plurality of serially coupled inverters includes:

a first transistor having first, second and control electrodes, said first electrode of said first transistor of each one of said plurality of serially coupled inverters being respectively coupled to an output of each one of said plurality of serially coupled inverters, said control electrode of said first transistor of each one of said plurality of serially coupled inverters being respectively coupled to an input of each one of said plurality of serially coupled inverters, and said second electrodes of said first transistor of each one of said plurality of serially coupled inverters being respectively coupled to receive said first plurality of currents, and a second transistor having first, second and control electrodes, said first electrode of said second transistor of each one of said plurality of serially coupled inverters being respectively coupled to said first electrode of said first transistor of each one of said plurality of serially coupled inverters, said control electrode of said second transistor of each one of said plurality of serially coupled inverters being respectively coupled to said control electrode of said first transistor of each one of said plurality of serially coupled inverters, and said second electrodes of said second transistors of each one of said plurality of serially coupled inverters being respectively coupled to receive said second plurality of currents.

11. A method for generating a 50% duty cycle clock from a voltage controlled oscillator circuit, the voltage controlled oscillator circuit circuit includes an output inverter having first and second transistors and a plurality of serially coupled voltage controlled inverters wherein the output inverter has an input coupled to an output of a last one of the plurality of serially coupled voltage controlled inverters and an output coupled to an input of a first one of the plurality of serially coupled voltage controlled inverters, the method comprising the steps of:

sinking a first plurality of currents respectively from the plurality of serially coupled voltage controlled inverters;

sourcing a second plurality of currents respectively to the plurality of serially coupled voltage controlled inverters; and ratioing the width of the first transistor with respect to the width of the second transistor such that the output inverter provides an output signal having a duty cycle substantially equal to 50%.

* * * * *